United States Patent
Huang et al.

(10) Patent No.: US 9,501,997 B2
(45) Date of Patent: Nov. 22, 2016

(54) GATE DRIVER AND DISPLAY APPARATUS

(71) Applicants: HEFEI BOE OPTOELECTRONICS TECHNOLOGY CO., LTD., Hefei (CN);
(Continued)

(72) Inventors: Jiacheng Huang, Beijing (CN); Jian He, Beijing (CN)

(73) Assignees: Hefei BOE Optoelectronics Technology Co., Ltd., Hefei (CN);
(Continued)

( * ) Notice: Subject to any disclaimer, the term of this patent is extended or adjusted under 35 U.S.C. 154(b) by 124 days.

(21) Appl. No.: 14/236,233

(22) PCT Filed: Jun. 27, 2013

(86) PCT No.: PCT/CN2013/078221
§ 371 (c)(1),
(2) Date: Jan. 30, 2014

(87) PCT Pub. No.: WO2014/176821
PCT Pub. Date: Nov. 6, 2014

(65) Prior Publication Data
US 2015/0179128 A1    Jun. 25, 2015

(30) Foreign Application Priority Data
Apr. 28, 2013    (CN) .......................... 2013 1 0155778

(51) Int. Cl.
*G09G 5/00* (2006.01)
*G09G 3/20* (2006.01)
(Continued)

(52) U.S. Cl.
CPC *G09G 5/00* (2013.01); *G09G 3/20* (2013.01); *G11C 19/28* (2013.01);
(Continued)

(58) Field of Classification Search
None
See application file for complete search history.

(56) References Cited

U.S. PATENT DOCUMENTS

| 8,872,859 B2 * | 10/2014 | Ko | G09G 3/3688 |
| | | | 345/212 |
| 2007/0091040 A1 * | 4/2007 | Wu | 345/87 |

(Continued)

FOREIGN PATENT DOCUMENTS

| CN | 2881871 Y | 3/2007 |
| CN | 101183504 A | 5/2008 |

(Continued)

OTHER PUBLICATIONS

English abstract for CN1953030B, one (1) page.
(Continued)

*Primary Examiner* — Nicholas Lee
*Assistant Examiner* — Duane N Taylor, Jr.
(74) *Attorney, Agent, or Firm* — Banner & Witcoff, Ltd.

(57) ABSTRACT

A gate driver (103) and a display device, which relate to the technical field of display, and are applicable to the design and manufacture of display devices. The gate driver (103) comprises: a power-off voltage detection circuit (101) and a power-off de-ghosting function circuit (204) connected to the power-off voltage detection circuit (101), wherein the power-off voltage detection circuit (101) is used for detecting a current voltage state, and outputting a control signal to the power-off de-ghosting function circuit (204) according to the voltage state, so that the power-off de-ghosting function circuit (204) outputs a signal to eliminate power-off ghosting according to the control signal. The gate driver (103) integrates the power-off voltage detection circuit (101) and the power-off de-ghosting function circuit (204); the integration level is high, and the display device can eliminate the power-off ghosting without the need to match the selected type of the gate driver (103) and a printed circuit board.

12 Claims, 2 Drawing Sheets

(71) Applicants: BOE TECHNOLOGY GROUP CO., LTD., Beijing (CN)

(73) Assignees: BOE Technology Group Co., Ltd., Beijing (CN)

(51) Int. Cl.
*G11C 19/28* (2006.01)
*H03K 19/0185* (2006.01)

(52) U.S. Cl.
CPC ............... *H03K 19/018521* (2013.01); *G09G 2310/0267* (2013.01); *G09G 2330/027* (2013.01)

(56) References Cited

U.S. PATENT DOCUMENTS

| | | | | |
|---|---|---|---|---|
| 2011/0012888 A1* | 1/2011 | Ko | ........................ | G09G 3/3648 345/212 |
| 2013/0176066 A1* | 7/2013 | Yamaguchi | ............ | H03K 3/353 327/333 |
| 2014/0016240 A1* | 1/2014 | Kawata | ................ | H02H 3/0935 361/95 |

FOREIGN PATENT DOCUMENTS

| | | |
|---|---|---|
| CN | 101197565 A | 6/2008 |
| CN | 101667387 A | 3/2010 |
| CN | 1953030 B | 5/2010 |
| CN | 102307013 A | 1/2012 |
| CN | 102801192 A | 11/2012 |

OTHER PUBLICATIONS

English abstract for CN101183504A, one (1) page.
English abstract for CN2881871Y, one (1) page.
English abstract for 101667387A, one (1) page.
First Office Action (Chinese language) for Chinese Patent Application No. 201310155778.5, dated Jan. 29, 2015; eight (8) pages.
English translation of First Office Action issued by the Chinese Patent Office for Chinese Patent Application No. 201310155778.5, dated Jan. 29, 2015; eight (8) pages.
PCT International Search Report, dated Jan. 9, 2014; thirteen (13) pages.
PCT Written Opinion of the International Searching Authority (English language), dated Jan. 9, 2014; seven (7) pages.
Nov. 3, 2015—International Preliminary Report on Patentability Appn PCT/CN2013/078221.
Aug. 11, 2015—(CN) Second Office Action Appn 201310155778.5 with English Tran.
Jan. 26, 2016—(CN)—Third Office Action Appn 201310155778.5 with English Tran.

* cited by examiner

GATE DRIVER AND DISPLAY APPARATUS

CROSS REFERENCE TO RELATED APPLICATIONS

This application is based on International Application No. PCT/CN2013/078221 filed on Jun. 27, 2013, which claims priority to Chinese National Application No. 201310155778.5 filed on Apr. 28, 2013, the contents of which are incorporated herein by reference.

TECHNICAL FIELD OF THE DISCLOSURE

The present disclosure relates to a field of display technology, and particularly to a gate driver and a display apparatus.

BACKGROUND

As shown in FIG. 1, an existing display includes a timing controller 100, a power supply 101, a source driver 102, a gate driver 103 and a display panel 104, wherein the source driver 102 controls signal output of data lines G1-Gn, and the gate driver 103 controls signal output of gate lines S1-Sn. In general, when the display operates normally, the power supply 101 supplies required voltages to respective modules, the timing controller 100 outputs image data signals and control signals to the source driver 102 and the gate driver 103, respectively, and the gate driver 103 turns on, one by one, thin film transistors connected on the respective scan lines, sequentially, to display different pictures. However, since liquid crystal capacitors $C_{LC}$ and storage capacitors $C_S$ of the display panel will be charged to accumulate charges thereon during the normal operation of the display panel, a residual picture will be presented on the display panel when the display panel is shut down, since the charges cannot be released effectively, this is the so-called shutdown residual.

In part of existing display apparatuses, a detection circuit is arranged on a printed circuit board (PCB), which outputs a residual elimination signal (XON), and a shutdown residual elimination functional circuit which receives the XON signal is arranged on a gate driver such that all of the gate lines are turned on, so as to eliminate the shutdown residual. In such display apparatuses, the shutdown residual can be eliminated only when the PCB and the gate driver must be matched with each other in type selection.

SUMMARY

In order to solve the above technical problems, there are provided in embodiments of the present disclosure a gate driver and a display apparatus, wherein a shutdown voltage detection circuit and a shutdown residual elimination functional circuit are integrated in the gate driver, and the gate driver has a high integration and can be directly applied to the display apparatus to eliminate the shutdown residual.

The embodiments of the present disclosure adopt the following technical solutions.

In one embodiment of the present disclosure, there is provided a gate driver comprising a shutdown voltage detection circuit and a shutdown residual elimination functional circuit connected to the shutdown voltage detection circuit, wherein the shutdown voltage detection circuit is used for detecting a voltage state at present and outputting a control signal to the shutdown residual elimination functional circuit based on the voltage state, and the shutdown residual elimination functional circuit is used for outputting a shutdown residual elimination signal according to the control signal.

Optionally, the shutdown voltage detection circuit comprises a comparison unit and a conversion unit, wherein the comparison unit is used to compare an inputted voltage and a reference voltage to obtain a comparison result, and comprises an input terminal, a grounded terminal and an output terminal; and the conversion unit is used to perform a signal conversion of the comparison result outputted from the comparison unit, and comprises a first input terminal, a second input terminal, a grounded terminal and an output terminal, wherein the first input terminal is connected to the output terminal of the comparison unit.

Optionally, the comparison unit comprises a comparator and a constant voltage source, a non-inverting terminal of the comparator is the input terminal of the comparison unit, an inverting terminal of the comparator is connected to one terminal of the constant voltage supply, and an output terminal of the comparator is the output terminal of the comparison unit; another terminal of the constant voltage source is the grounded terminal of the comparison unit, and the constant voltage source is used to provide the reference voltage.

Optionally, the conversion unit is an inverter comprising a PMOS transistor and a NMOS transistor, each of which has a gate, a source and a drain, respectively, the gate of the PMOS transistor is used as the first input terminal of the conversion unit, the source of the PMOS transistor is used as the second input terminal of the conversion unit, and the drain of the PMOS transistor is used as the output terminal of the conversion unit; and the gate of the NMOS transistor and the gate of the PMOS transistor are connected to each other, the drain of the NMOS transistor and the drain of the PMOS transistor are connected to each other, and the source of the NMOS transistor is the grounded terminal of the conversion unit.

Optionally, the shutdown residual elimination functional circuit comprises a plurality of logic circuits for controlling thin film transistors on respective gate lines to be turned.

Optionally, the gate driver further comprises a shift register and a level converter, wherein the logic circuits comprise OR gate circuits which include a first input terminal, a second input terminal and an output terminal, the first input terminal of each of the OR gate circuits is connected to the output terminal of the conversion unit of the shutdown voltage detection circuit, the second input terminal of each of the OR gate circuits is connected to the shift register, and the output terminal of each of the OR gate circuits is connected to the level converter.

In another embodiment of the invention, there is provided a display apparatus including any of the gate drivers provided in the embodiments of the present disclosure.

Optionally, the display apparatus further includes a voltage dividing circuit which includes an input terminal, a grounded terminal and an output terminal, wherein the output terminal of the voltage dividing circuit is connected to the input terminal of the comparison unit of the gate driver.

Optionally, the voltage dividing circuit includes a first resistor and a second resistor, wherein a first terminal of the first resistor is the input terminal of the voltage dividing circuit, and a second terminal of the first resistor is the output terminal of the voltage dividing circuit; a first terminal of the second resistor is connected to the second terminal of the first resistor, and a second terminal of the second resistor is the grounded terminal of the voltage dividing circuit.

Optionally, the first resistor and the second resistor are adjustable resistors.

In the gate driver and the display apparatus provided in the embodiments of the present disclosure, the shutdown voltage detection circuit and the shutdown residual elimination functional circuit are integrated in the gate driver, when the display apparatus is in a shutdown state, the shutdown voltage detection circuit detects that the input voltage is less than a predetermined threshold and outputs a control signal to the shutdown residual elimination functional circuit, and the shutdown residual elimination functional circuit outputs a shutdown residual elimination signal after the receipt of the control signal, respective thin film transistors are turned on under the control of the gate driver, so that the charges accumulated on liquid crystal capacitors and storage capacitors can be released rapidly, so as to achieve the shutdown residual elimination. Further, the shutdown voltage detection circuit and the shutdown residual elimination functional circuit are integrated together and the gate driver has a high integration, such that a malfunction rate of the gate driver may be reduced and there is no need for matching use of the PCB and the gate driver having the shutdown residual elimination functional circuit, which is more convenient.

REFERENCE NUMERALS

100—timing controller; 101—power supply; 102—source driver; 103—gate driver; 104—display panel; 201—shutdown voltage detection circuit; 202—input buffer; 203—shift register; 204—shutdown residual elimination functional circuit; 205—level converter; 206—output buffer; 2011—comparison unit; 2012—conversion unit; U—comparator; Q1—PMOS transistor; Q2—NMOS transistor; G—gate; S—source; D—drain; 30—voltage dividing circuit; R1—first resistor; R2—second resistor

DETAILED DESCRIPTION

Technical solutions in embodiments of the present disclosure will be described clearly and thoroughly below in connection with drawings of the embodiments of the present disclosure. It should be obvious for those skilled in the art that the embodiments described below are only a part of embodiments of the present disclosure rather than all of the embodiments of the present disclosures.

Figure 1:
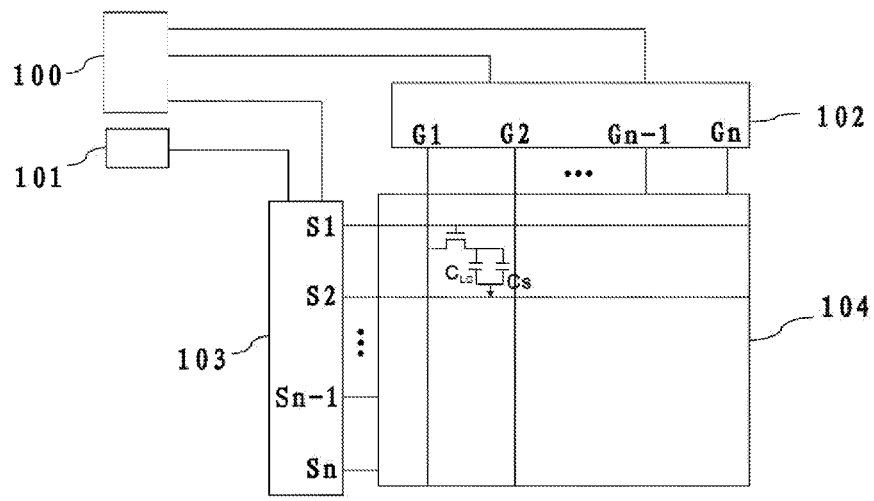
FIG. 1 is a schematic diagram of the display principle of an existing display.
Figure 2:
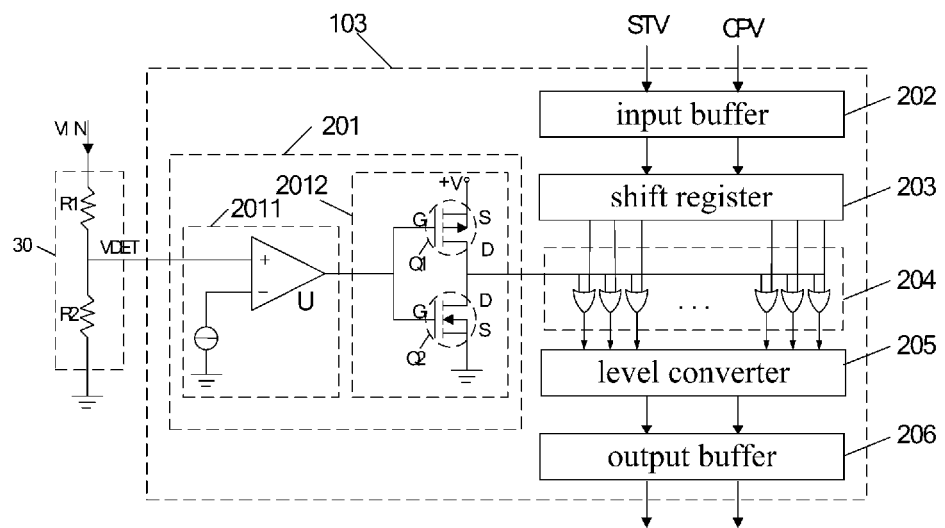
FIG. 2 is a schematic diagram of a partial structure of a display apparatus provided in an embodiment of the present disclosure.

As shown in FIG. 2, there is provided in an embodiment of the present disclosure a gate driver 103, which includes a shutdown voltage detection circuit 201 and a shutdown residual elimination functional circuit 204 connected to the shutdown voltage detection circuit 201, wherein the shutdown voltage detection circuit 201 is used for detecting a voltage state at present and outputting a control signal to the shutdown residual elimination functional circuit 204 according to the voltage state, and the shutdown residual elimination functional circuit 204 is used for outputting a shutdown residual elimination signal according to the control signal.

It should be noted that, when the voltage supply is shut down, the shutdown voltage detection circuit 201 can detect the variation of a supply voltage, when the supply voltage is less than a predetermined threshold, the shutdown voltage detection circuit outputs a control signal, the shutdown residual elimination functional circuit 204 outputs the shutdown residual elimination signal after the receipt of the control signal output from the shutdown voltage detection circuit 201, the gate driver 103 controls respective thin film transistors to be turned on, such that the charges accumulated on liquid crystal capacitors and storage capacitors can be released rapidly, so as to achieve the shutdown residual elimination. The shutdown residual elimination signal in the embodiment of the present disclosure differs from the XON signal in the prior art, and the shutdown residual elimination functional circuit in the embodiment of the present disclosure also differs from that in the prior art.

Figure 3:
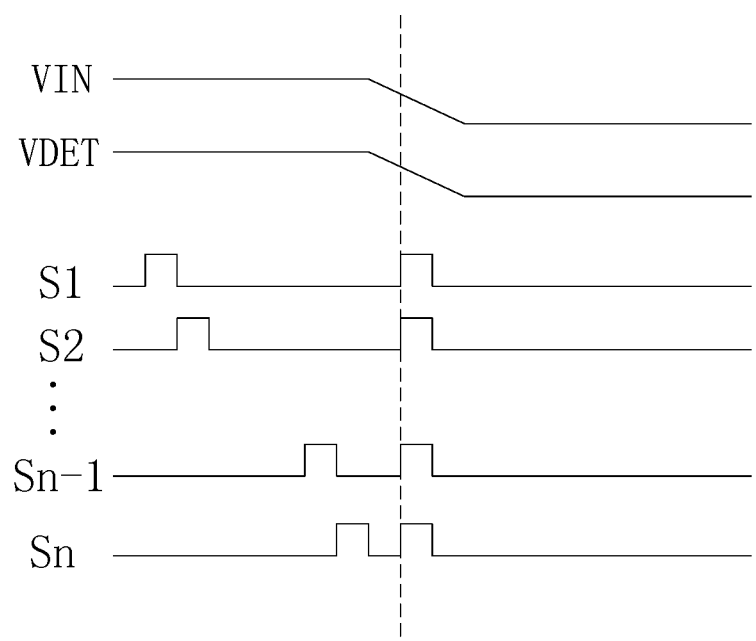
FIG. 3 is a schematic diagram of a timing of a shutdown residual elimination function.

Particularly, as shown in FIG. 2, the gate driver 103 further includes an input buffer 202, a shift register 203, a level converter 205 and an output buffer 206. When the display apparatus operates normally, the input buffer 202 of the gate driver 103 receives a frame synchronization signal STV (start vertical) and a row synchronization signal CPV (clock pulse vertical) input from the timing controller and outputs the same to the shift register 203, and the shift register 203 outputs a high level signal to gate lines progressively under the control of the frame synchronization signal and the row synchronization signal, and outputs, via the level converter 205 and the output buffer 206, gate turning on or off signals for the respective lines such that gate lines of a corresponding frame of picture are scanned progressively and displayed. When the display apparatus is at a shutdown state, as shown in FIG. 3, the shutdown voltage detection circuit 201 outputs a control signal to the shutdown residual elimination functional circuit 204 when it detects that the input voltage VDET is less than a predetermined threshold, and the shutdown residual elimination functional circuit 204 outputs the shutdown residual elimination signal (that is, high level signals corresponding to the respective gate lines) to the level converter 205 according to the received control signal, and then outputs, via the level converter 205 and the output buffer 206, gate turning on signals of the respective lines. As shown in FIG. 3, during normal operation, those signals on the gate lines S1, S2, . . . , Sn-1 and Sn are scanning signals, that is, accordingly, only one gate line is at a high level and other gate lines are at a low level. When VDET is lower than the predetermined threshold, the shutdown voltage detection circuit 201 outputs the control signal, and the shutdown residual elimination functional circuit 204 outputs the high level signals of the respective gate lines to the level converter 205 after the receipt of the control signal outputted from the shutdown voltage detection circuit 201, such that the gate lines S to Sn are all at a high level, the respective film transistors on the liquid crystal panel are all turned on accordingly, thereby the charges accumulated on liquid crystal capacitors and storage capacitors can be released rapidly so as to eliminate the shutdown.

There is provided in the embodiments of the present disclosure a gate driver, in which the shutdown voltage detection circuit and the shutdown residual elimination functional circuit are configured, when the display apparatus is in a shutdown state, the shutdown voltage detection circuit detects that the input voltage is less than the predetermined threshold and then outputs the control signal to the shutdown residual elimination functional circuit, and the shutdown residual elimination functional circuit outputs high level signals of the respective gate lines to the level converter according to the control signal to control the respective thin film transistors to be turned on via the gate driver, so that the charges accumulated on liquid crystal capacitors and storage capacitors are released rapidly, so as to eliminate the shutdown residual. In the gate driver provided in the embodiments of the present disclosure, the shutdown voltage detection circuit and the shutdown residual elimination functional circuit are integrated together, and the high integration of the gate driver can reduce the malfunction rate of the gate driver and the cost of external circuits. The display device can eliminate the shutdown residual by the gate driver without matching use of the PCB and the gate driver having the shutdown residual elimination functional circuit, which is more convenient.

Optionally, as shown in FIG. 2, the shutdown voltage detection circuit 201 includes a comparison unit 2011 and a conversion unit 2012.

The comparison unit 2011 is used for comparing an input voltage and a reference voltage and outputting a comparison result, and includes an input terminal, a grounded terminal and an output terminal.

The conversion unit 2012 is used for performing a signal conversion of the comparison result outputted from the comparison unit 2011, and includes a first input terminal, a second input terminal, a grounded terminal and an output terminal, wherein the first input terminal is connected to the output terminal of the comparison unit.

It should be noted that the shutdown voltage detection circuit is used for detecting the variation of the input voltage and has a variety of different implementations according to particular situations, and detailed descriptions will be given by taking one of the different implementations as an example. The reference voltage of the comparison unit can be set to different values according to different display device. The conversion unit performs a signal conversion of the comparison result outputted from the comparison unit, that is, when the comparison unit outputs a high level, the conversion unit outputs a low level accordingly; when the comparison unit outputs a low level, the conversion unit outputs a high level accordingly.

Optionally, as shown in FIG. 2, the comparison unit 2011 includes a comparator U and a constant voltage source, wherein a non-inverting terminal of the comparator U is the input terminal of the comparison unit, an inverting terminal of the comparator is connected to one terminal of the constant voltage supply, and an output terminal of the comparator is the output terminal of the comparison unit; another terminal of the constant voltage source is grounded and is the grounded terminal of the comparison unit, and the constant voltage source is used for supplying the reference voltage.

The comparison unit is used for comparing the input voltage and the reference voltage to output a high level or a low level for detecting a supply state at present. The reference voltage is preset and can be set to different values according to different display devices. Particularly, as shown in FIG. 2 the input voltage inputted from the non-inverting terminal of the comparator is compared with the voltage of the constant voltage source by the comparator, when the input voltage VDET is higher than the voltage of the constant voltage source, the comparator outputs a high level, and a low level is outputted via a inverter, at this time, the control signal outputted from the shutdown voltage detection circuit is a normal display signal of the display panel; when the input voltage VDET is less than the voltage of the constant voltage source, the comparator outputs a low level and a high level is outputted via the inverter, at this time, the control signal outputted from the shutdown voltage detection circuit is a shutdown residual elimination signal.

Optionally, the conversion unit 2012 is an inverter including a PMOS transistor Q1 and a NMOS transistor Q2, each of which has a gate G, a source S and a drain D, respectively, wherein the gate G of the PMOS transistor Q1 is used as the first input terminal of the conversion unit connected to the output terminal of the conversion unit; the source S of the PMOS transistor Q1 is used as the second input terminal of the conversion unit for inputting a high level, and the drain D of the PMOS transistor Q1 is used as the output terminal of the conversion unit; the gate G of the NMOS transistor Q2 and the gate G of the PMOS transistor Q1 are connected to each other, the drain D of the NMOS transistor Q2 and the drain D of the PMOS transistor Q1 are connected to each other, and the source S of the NMOS transistor Q2 is the grounded terminal of the conversion unit.

Specifically, when the comparator outputs a high level, the NMOS transistor of the conversion unit is turned on and outputs a low level correspondingly, and at this time, the control signal outputted from the shutdown voltage detection circuit 201 is a normal display signal of the display panel; when the comparator outputs a low level, the PMOS transistor of the conversion unit is turned on and outputs a high level accordingly, and at this time, the shutdown voltage detection circuit outputs a control signal for eliminating a shutdown residual. It should be noted that the specific configurations for outputting the shutdown residual elimination control signal may be designed as required, and descriptions will be given by taking the above configure as an example in the embodiment of the present disclosure. For example, it may be specified that the comparator outputs a high level, and the shutdown voltage detection circuit outputs the shutdown residual elimination signal, of which the principle is the same as above, and herein it is not repeated.

It should be noted that, as shown in FIG. 2, gates of the PMOS transistor and the NMOS transistor are located on the left side of the PMOS transistor and the NMOS transistor, the source of the NMOS transistor is the grounded terminal and the source of the PMOS transistor is the terminal connected to a high level.

Optionally, the shutdown residual elimination functional circuit 2012 includes logic circuits for controlling thin film transistors of respective gate lines to be turned on. Particularly, as shown in FIG. 2, the gate driver 103 further includes a shift register 203 and a level converter 205, wherein the logic circuits include OR gate circuits, each of which includes a first input terminal, a second input terminal and an output terminal, the first input terminal of each of the OR gate circuits is connected to the output terminal of the conversion unit of the shutdown voltage detection circuit, the second input terminal of each of the OR gate circuits is connected to the shift register, and the output terminal of each of the OR gate circuits is connected to the level converter.

Herein, the operation principle of the OR gate circuit lies in that the OR gate circuit outputs a high level when the high level is inputted to its first input terminal or its second input terminal; and outputs a low level when a low level is inputted to both of the first input terminal and the second input terminal simultaneously. Specifically, the number of the OR gate circuits is the same as the number of the gate lines on the display panel, and each of the OR gate circuits controls the turning-on of the thin film transistors on a corresponding gate line. When the display panel operates normally, the voltage at the non-inverting terminal of the comparator is higher than the voltage at the inverting terminal of the comparator, and thus the comparator outputs a high level and a low level is outputted via the inverter such that in the respective OR gate circuits, in response to the output of the shift register, the thin film transistors on one gate line are turned on sequentially to realize scanning and displaying; when the display panel is in a shutdown state, the voltage at the non-inverting terminal of the comparator is less than the voltage at the inverting terminal of the comparator, the comparator outputs a low level, and a high level is outputted via a inverter, since the first input terminal of each of OR gate circuits is connected to the output terminal of the inverter, the respective OR gate circuits output a high level respectively, and thus the thin film transistors on the respective gate lines are turned on to eliminate the shutdown residual.

It should be noted that, in the embodiment of the present disclosure, the OR gate circuit may be a circuit constituted by different electronic elements for implementing the function thereof, for example, the OR gate circuit may be constituted by two thin film transistors, and the embodiment of the present disclosure is not limited thereto.

In an embodiment of the present disclosure, there is provided a display apparatus including any of the gate drivers provided in the embodiments of the present disclosure. The display apparatus may be display devices such as liquid crystal displays, electronic papers. Organic Light-Emitting Diode (OLED) displays, etc. and any products or components having a display function such as televisions, digital cameras, mobile phones, tablet computer, etc. including these display devices.

Optionally, as shown in FIG. 2, the display apparatus further includes a voltage dividing circuit 30 which includes an input terminal, a grounded terminal and an output terminal, wherein the output terminal is connected to the input terminal of the comparison unit of the gate driver.

It should be noted that, the voltage VIN inputted from the input terminal of the voltage dividing circuit 30 is the supply voltage of the display screen. The voltage dividing circuit 30 can divide the supply voltage inputted from the input terminal to obtain an output voltage VDET, which is enabled to be compared to the preset voltage set by the comparison unit. For example, the supply voltage inputted from the input terminal may be different based on different applications in the existing display device. In the prior art, the supply voltage of tablet computers is usually 3.3V, the supply voltage of laptop computers is usually 5V, and the supply voltage of televisions is 12V. The preset voltage of the comparison unit is commonly set as 1.2V, that is, the voltage of the constant voltage source is 1.2V, and thus the inputted voltage may be divided by the voltage dividing circuit 30 to enable it to be compared with the preset voltage. The voltage dividing circuit 30 and the gate driver 103 are arranged separately, and for the display apparatus, the output voltage at the output terminal of the voltage dividing circuit may be set to different values according to particular power supply situations.

Optionally, as shown in FIG. 2, the voltage dividing circuit 30 includes a first resistor R1 and a second resistor R2, wherein a first terminal of the first resistor R1 is the input terminal of the voltage dividing circuit, and a second terminal of the first resistor R1 is the output terminal of the voltage dividing circuit; a first terminal of the second resistor R2 is connected to the second terminal of the first resistor, and a second terminal of the second resistor R2 is the grounded terminal of the voltage dividing circuit.

It should be noted that, for the convenience of description, in the embodiment of the present disclosure, the upper terminals of the first resistor and the second resistor are the first terminals of the first resistor and the second resistor, and the lower terminals of the first resistor and the second resistor are the second terminals of the first resistor and the second resistor.

Exemplarily, as shown in FIGS. 2 and 3, the input voltage inputted to the input terminal of the voltage dividing circuit 30 is VIN, the output voltage outputted via the first resistor and the second resistor is VDET which is compared to the voltage of the constant voltage source of the comparison unit 2011 by the comparator. When the supply voltage VIN inputted from the input terminal of the voltage dividing circuit 30 is less than a predetermined value, VDET obtained by the voltage dividing circuit 30 is also less than the voltage of the constant voltage source, the comparator U outputs a low level, the PMOS transistor of the conversion unit 2012 is turned on and a high level is outputted via a inverter such that the conversion unit 2012 outputs the shutdown residual elimination signal to eliminate the shutdown residual.

Optionally, as shown in FIG. 2, the first resistor R1 and the second resistor R2 are adjustable resistors, such that the value of VDET outputted from the voltage dividing circuit can be conveniently adjusted according to actual situations, which may be suitable to different display apparatuses.

The above descriptions are only the specific embodiments of the present disclosure, but in no way limit the scope of the present disclosure. Those skilled in the art may make readily modifications or variations to the above embodiments within the technical scope disclosed by the present disclosure, which should to be included within the spirit and scope of the present disclosure. Therefore, the protection scope of the present disclosure should be defined by the protection scope of the claims.

What is claimed is:

1. A gate driver, comprising:
   a shift register, a level converter, a shutdown voltage detection circuit and a shutdown residual elimination functional circuit connected to the shutdown voltage detection circuit,
   wherein the shutdown voltage detection circuit is used for detecting a voltage state at present and outputting a control signal to the shutdown residual elimination functional circuit based on the voltage state, and the shutdown residual elimination functional circuit is used for outputting a shutdown residual elimination signal according to the control signal,
   the shutdown voltage detection circuit comprises a comparison unit and a conversion unit,
   the comparison unit is used to compare an inputted voltage and a reference voltage to obtain a comparison result, and comprises an input terminal, a grounded terminal and an output terminal; and
   the conversion unit is used to perform a signal conversion of the comparison result outputted from the comparison unit, and comprises a first input terminal, a second input terminal, a grounded terminal and an output terminal, wherein the first input terminal is connected to the output terminal of the comparison unit, the shutdown residual elimination functional circuit includes a plurality of identical logic circuits for controlling thin film transistors on respective gate lines to be turned on or off,
   wherein the logic circuit includes a first input terminal, a second input terminal and an output terminal, the first input terminal of the logic circuit is connected to the output terminal of the conversion unit, the second input terminal of the logic circuit is connected to the shift register, and the output terminal of the logic circuit is connected to the level converter.

2. The gate driver of claim 1, wherein the comparison unit comprises a comparator and a constant voltage source, a non-inverting terminal of the comparator is the input terminal of the comparison unit, an inverting terminal of the comparator is connected to one terminal of the constant voltage source, and an output terminal of the comparator is the output terminal of the comparison unit; another terminal of the constant voltage source is the grounded terminal of the comparison unit, and the constant voltage source is used to provide the reference voltage.

3. The gate driver of claim 1, wherein the conversion unit is an inverter comprising a PMOS transistor and a NMOS transistor, each of which has a gate, a source and a drain, respectively, the gate of the PMOS transistor is used as the first input terminal of the conversion unit, the source of the PMOS transistor is used as the second input terminal of the conversion unit, and the drain of the PMOS transistor is used as the output terminal of the conversion unit; and the gate of the NMOS transistor and the gate of the PMOS transistor are connected to each other, the drain of the NMOS transistor and the drain of the PMOS transistor are connected to each other, and the source of the NMOS transistor is the grounded terminal of the conversion unit.

4. The gate driver of claim 1,
wherein the logic circuits comprise OR gate circuits.

5. A display apparatus comprising a gate driver which comprises a shift register, a level converter, a shutdown voltage detection circuit and a shutdown residual elimination functional circuit connected to the shutdown voltage detection circuit,
wherein the shutdown voltage detection circuit is used for detecting a voltage state at present and outputting a control signal to the shutdown residual elimination functional circuit based on the voltage state, and the shutdown residual elimination functional circuit is used for outputting a shutdown residual elimination signal according to the control signal, wherein the shutdown residual elimination functional circuit comprises a plurality of identical logic circuits for controlling thin film transistors on respective gate lines to be turned on,
wherein the logic circuit includes a first input terminal, a second input terminal and an output terminal, the first input terminal of the logic circuit is connected to the output terminal of the conversion unit, the second input terminal of the logic circuit is connected to the shift register, and the output terminal of the logic circuit is connected to the level converter.

6. The display apparatus of claim 5, further comprising a voltage dividing circuit which includes an input terminal, a grounded terminal and an output terminal, wherein the output terminal of the voltage dividing circuit is connected to the input terminal of a comparison unit of the gate driver.

7. The display apparatus of claim 6, wherein the voltage dividing circuit includes a first resistor and a second resistor, wherein a first terminal of the first resistor is the input terminal of the voltage dividing circuit, and a second terminal of the first resistor is the output terminal of the voltage dividing circuit; a first terminal of the second resistor is connected to the second terminal of the first resistor, and a second terminal of the second resistor is the grounded terminal of the voltage dividing circuit.

8. The display apparatus of claim 7, wherein the first resistor and the second resistor are adjustable resistors.

9. The display apparatus of claim 5, wherein the shutdown voltage detection circuit includes a comparison unit and a conversion unit,
wherein the comparison unit is used to compare an inputted voltage and a reference voltage to obtain a comparison result, and comprises an input terminal, a grounded terminal and an output terminal; and
the conversion unit is used to perform a signal conversion of the comparison result outputted from the comparison unit, and comprises a first input terminal, a second input terminal, a grounded terminal and an output terminal, wherein the first input terminal is connected to the output terminal of the comparison unit.

10. The display apparatus of claim 9, wherein the comparison unit comprises a comparator and a constant voltage source, a non-inverting terminal of the comparator is the input terminal of the comparison unit, an inverting terminal of the comparator is connected to one terminal of the constant voltage source, and an output terminal of the comparator is the output terminal of the comparison unit; another terminal of the constant voltage source is the grounded terminal of the comparison unit, and the constant voltage source is used to provide the reference voltage.

11. The display apparatus of claim 9, wherein the conversion unit is an inverter comprising a PMOS transistor and a NMOS transistor, each of which has a gate, a source and a drain, respectively, the gate of the PMOS transistor is used as the first input terminal of the conversion unit, the source of the PMOS transistor is used as the second input terminal of the conversion unit, and the drain of the PMOS transistor is used as the output terminal of the conversion unit; and the gate of the NMOS transistor and the gate of the PMOS transistor are connected to each other, the drain of the NMOS transistor and the drain of the PMOS transistor are connected to each other, and the source of the NMOS transistor is the grounded terminal of the conversion unit.

12. The display apparatus of claim 9,
wherein the logic circuits comprise OR gate.

* * * * *